(12) United States Patent
Otremba et al.

(10) Patent No.: US 9,412,626 B2
(45) Date of Patent: *Aug. 9, 2016

(54) METHOD FOR MANUFACTURING A CHIP ARRANGEMENT

(71) Applicant: Infineon Technologies AG, Neubiberg (DE)

(72) Inventors: Ralf Otremba, Kaufbeuren (DE); Josef Hoeglauer, Heimstetten (DE); Juergen Schredl, Mering (DE); Xaver Schloegel, Sachsenkam (DE); Klaus Schiess, Allensbach (DE); Bernd Roemer, Bernhardswald (DE); Edward Fuergut, Dasing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/935,510

(22) Filed: Nov. 9, 2015

(65) Prior Publication Data

US 2016/0064255 A1 Mar. 3, 2016

Related U.S. Application Data

(63) Continuation of application No. 13/678,577, filed on Nov. 16, 2012, now Pat. No. 9,184,066.

(51) Int. Cl.
*H01L 21/00* (2006.01)
*H01L 21/56* (2006.01)
(Continued)

(52) U.S. Cl.
CPC .............. *H01L 21/565* (2013.01); *H01L 21/56* (2013.01); *H01L 23/3107* (2013.01); *H01L 23/3135* (2013.01); *H01L 23/34* (2013.01); *H01L 23/495* (2013.01); *H01L 23/49562* (2013.01); *H01L 23/49568* (2013.01); *H01L 23/552* (2013.01); *H01L 24/05* (2013.01); *H01L 24/32* (2013.01); *H01L 24/45* (2013.01); *H01L 24/48* (2013.01); *H01L 24/73* (2013.01); *H01L 24/97* (2013.01); *H01L 2224/0401* (2013.01); *H01L 2224/04042* (2013.01); *H01L 2224/05624* (2013.01); *H01L 2224/05647* (2013.01);
(Continued)

(58) Field of Classification Search
USPC .................. 257/100, 433, 667, 787–796, 257/E31.117–E31.118, E51.02, 257/E23.116–E23.14; 438/15, 25, 26, 51, 438/55, 64, 112, 124, 126, 127
See application file for complete search history.

(56) References Cited

U.S. PATENT DOCUMENTS 8,659,125 B2   2/2014  Chen et al.
9,184,066 B2 * 11/2015  Otremba ................. H01L 23/34
(Continued)

FOREIGN PATENT DOCUMENTS

CN          101471329 A       7/2009

*Primary Examiner* — Dao H Nguyen
*Assistant Examiner* — Tram H Nguyen
(74) *Attorney, Agent, or Firm* — Viering, Jentschura & Partner mbB

(57) ABSTRACT

A method for manufacturing a chip arrangement, including disposing a chip over a carrier, wherein the bottom side of the chip is electrically connected to the first carrier side via one or more contact pads on the chip bottom side, disposing a first encapsulation material over the first carrier side, wherein the first encapsulation material at least partially surrounds the chip, and disposing a second encapsulation material over a second carrier side, wherein the second encapsulation material is in direct contact with the second carrier side.

18 Claims, 12 Drawing Sheets

(51) Int. Cl.
- H01L 23/34 (2006.01)
- H01L 23/495 (2006.01)
- H01L 23/31 (2006.01)
- H01L 23/00 (2006.01)
- H01L 23/552 (2006.01)

(52) U.S. Cl.
CPC ............ *H01L 2224/0603* (2013.01); *H01L 2224/06181* (2013.01); *H01L 2224/16245* (2013.01); *H01L 2224/32245* (2013.01); *H01L 2224/45147* (2013.01); *H01L 2224/48091* (2013.01); *H01L 2224/48247* (2013.01); *H01L 2224/48472* (2013.01); *H01L 2224/48824* (2013.01); *H01L 2224/48847* (2013.01); *H01L 2224/73265* (2013.01); *H01L 2224/8592* (2013.01); *H01L 2924/00014* (2013.01); *H01L 2924/12032* (2013.01); *H01L 2924/1301* (2013.01); *H01L 2924/1305* (2013.01); *H01L 2924/13034* (2013.01); *H01L 2924/13055* (2013.01); *H01L 2924/13091* (2013.01); *H01L 2924/1815* (2013.01); *H01L 2924/3025* (2013.01)

(56) References Cited

U.S. PATENT DOCUMENTS

| | | | |
|---|---|---|---|
| 2005/0133902 A1* | 6/2005 | Pavier | H01L 23/49562 257/691 |
| 2007/0090524 A1* | 4/2007 | Abbott | H01L 21/4828 257/731 |
| 2009/0051052 A1 | 2/2009 | Yoshioka et al. | |
| 2009/0166819 A1 | 7/2009 | Chen et al. | |

* cited by examiner

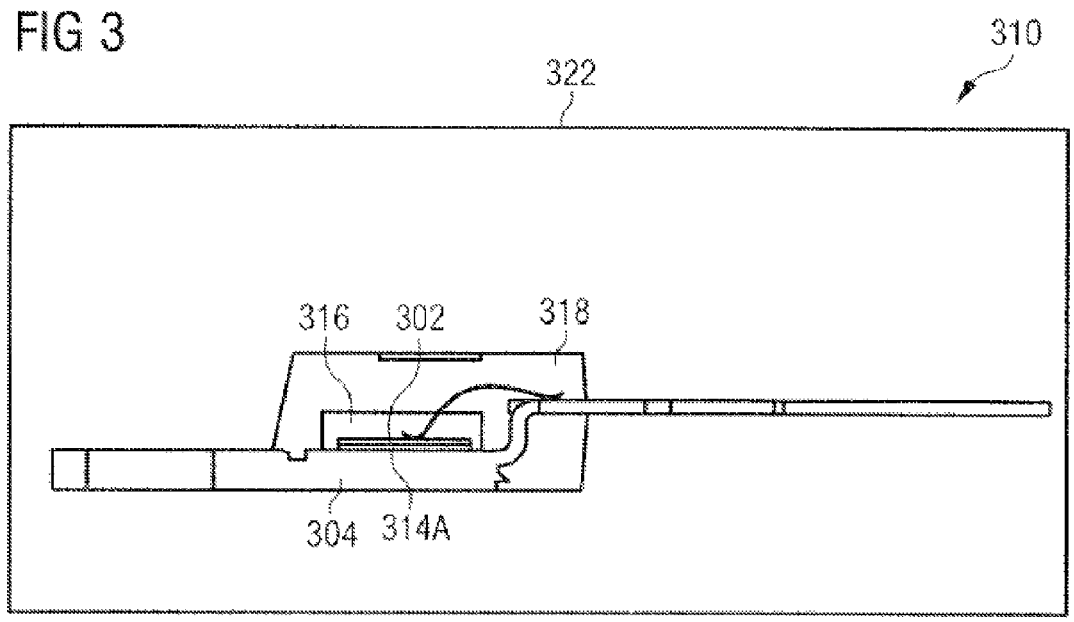

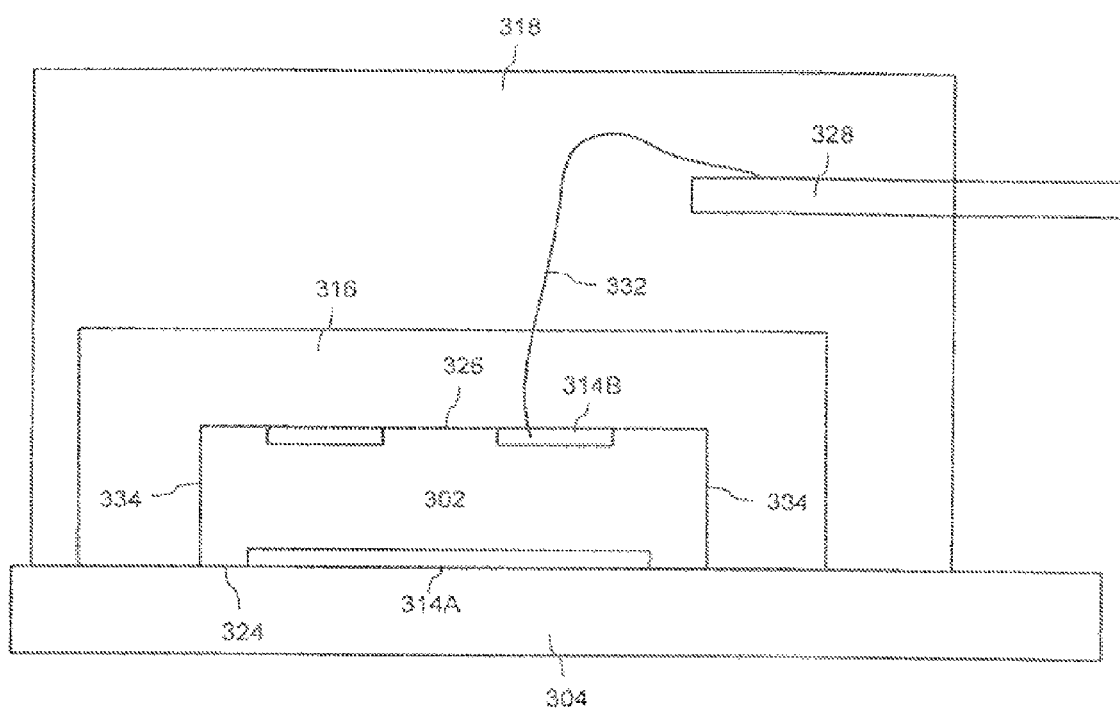

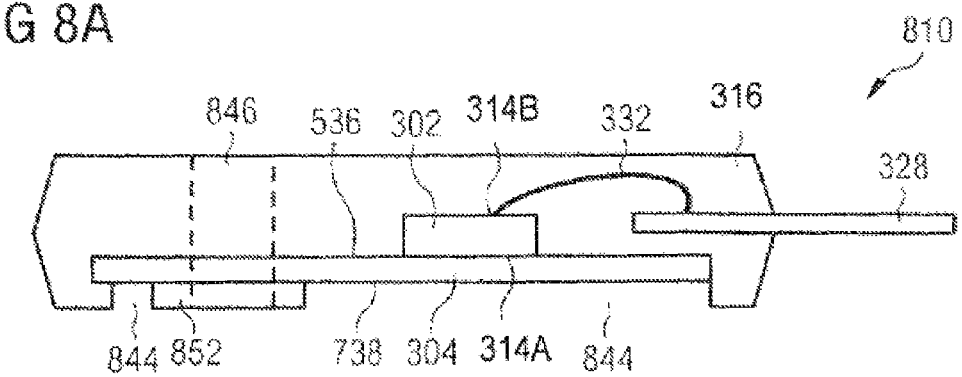
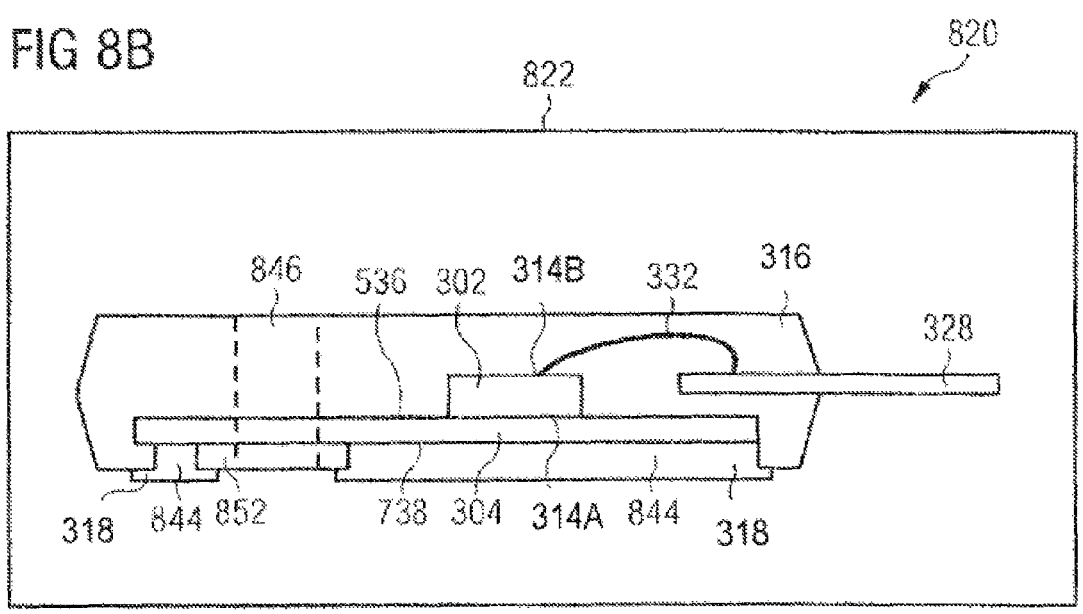

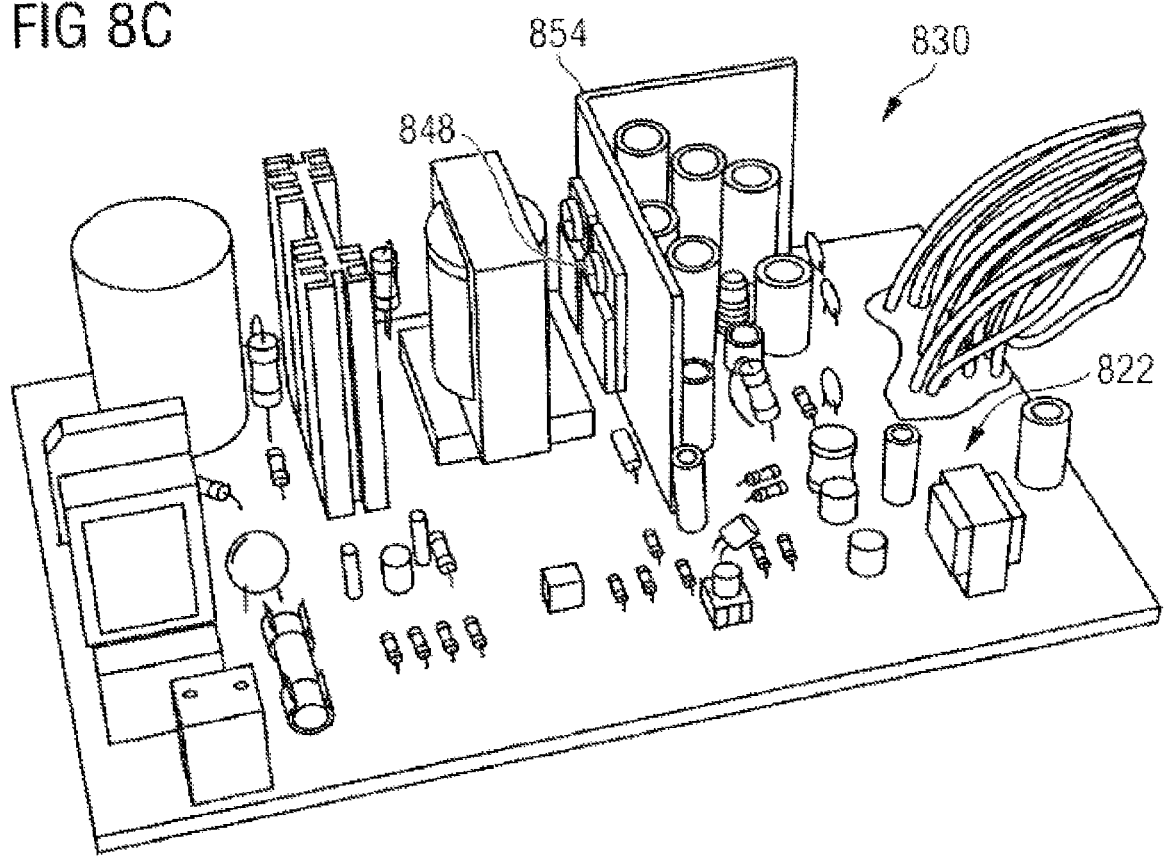

910 — at least partially surrounding a chip with a first encapsulation material;

920 — disposing the chip over a first carrier side, wherein a contact pad of the chip is electrically contacted to the carrier;

930 — forming a second encapsulation material at least partially over at least one of the first encapsulation material and the carrier.

METHOD FOR MANUFACTURING A CHIP ARRANGEMENT

CROSS-REFERENCE TO RELATED APPLICATIONS

This application is a continuation of application Ser. No. 13/678,577 filed on Nov. 16, 2012, which is hereby incorporated by reference in its entirety.

TECHNICAL FIELD

Various embodiments relate generally to chip arrangements and methods for manufacturing a chip arrangement.

BACKGROUND

Housings for power semiconductors demand excellent thermal and protection performance for the semiconductor chips. As shown in FIG. 1, power semiconductor device housings of today may be based on a chip 102, a lead frame 104 and an epoxy mold compound 106 for chip encapsulation. Bond wires 108 and solder 112 may also be used in typical chip packages. Furthermore, various requirements are placed on chip encapsulation materials. Chemical, electrical and mechanical requirements for sufficient chip protection should be satisfied. This may lead to a significant rise in manufacturing costs, wherein the lead frame and the epoxy mold compound tend to dominate the overall cost of the housing.

SUMMARY

Various embodiments provide a chip arrangement including: a carrier; a chip disposed over the carrier, the chip including one or more contact pads, wherein a first contact pad of the one or more contact pads is electrically contacted to the carrier; a first encapsulation material at least partially surrounding the chip; and a second encapsulation material at least partially surrounding the first encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a chip arrangement according to various embodiments.

FIGS. 4A to 4D show a method for manufacturing a chip arrangement according to various embodiments.

FIGS. 8A to 8C show a method for manufacturing a chip arrangement according to various embodiments.

FIG. 9 shows a method for manufacturing a chip arrangement according to an embodiment.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration" or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide a chip housing for a power chip package, wherein the cost and performance of the power chip package such as the chip encapsulation material may be improved.

Figure 1:
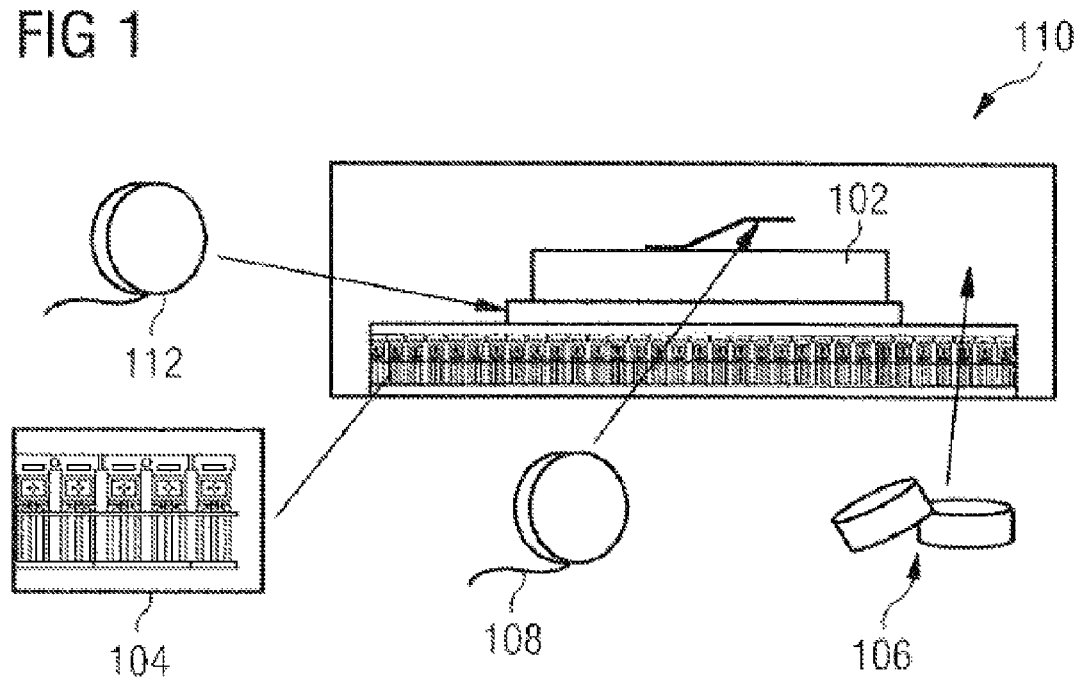
FIG. 1 shows the construction of a typical power package.
Figure 2:
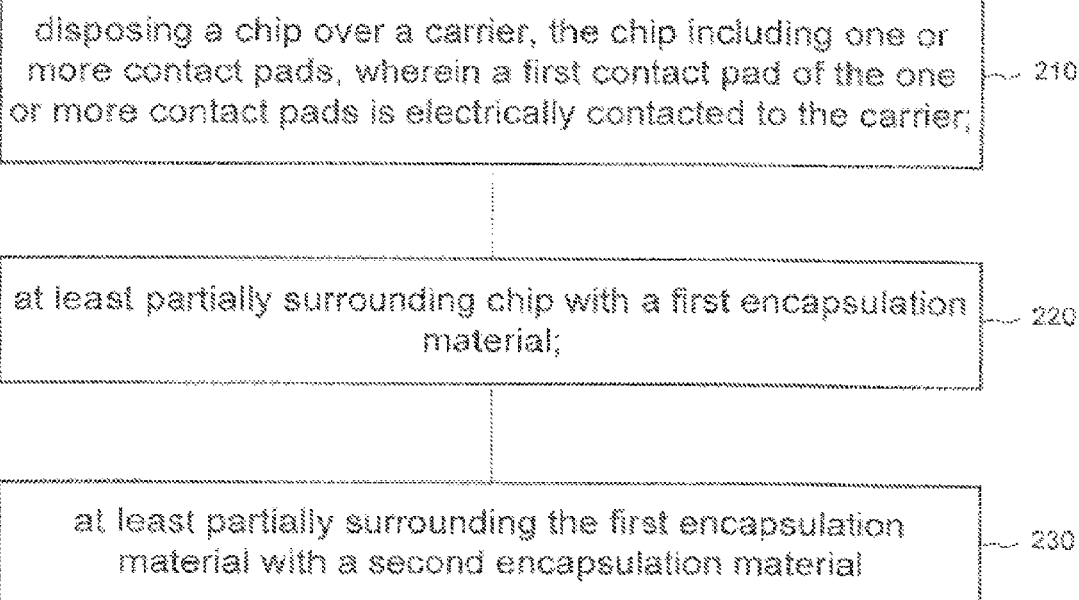
FIG. 2 shows a method for manufacturing a chip arrangement according to an embodiment.

FIG. 2 shows a method 200 for manufacturing a chip arrangement according to an embodiment. The method 200 may include:

disposing a chip over a carrier, the chip including one or more contact pads, wherein a first contact pad of the one or more contact pads is electrically contacted to the carrier (in 210);

at least partially surrounding the chip with a first encapsulation material (in 220); and at least partially surrounding the first encapsulation material with a second encapsulation material (in 230).

FIG. 3 shows a side view 310 of a chip arrangement 302 according to various embodiments.

The chip arrangement 322 may include a carrier 304. The chip 302, e.g. a semiconductor die, may be disposed over the carrier 304. The chip 302 may include one or more contact pads, wherein a first contact pad 314A of the one or more contact pads may be electrically contacted to the carrier 304. A first encapsulation material 316 may at least partially surround the chip 302. The second encapsulation material 318 may at least partially surround the first encapsulation material 316.

FIGS. 4A to 4D show illustrations of a method 400 for manufacturing chip arrangement 322 according to various embodiments.

Figure 4A:
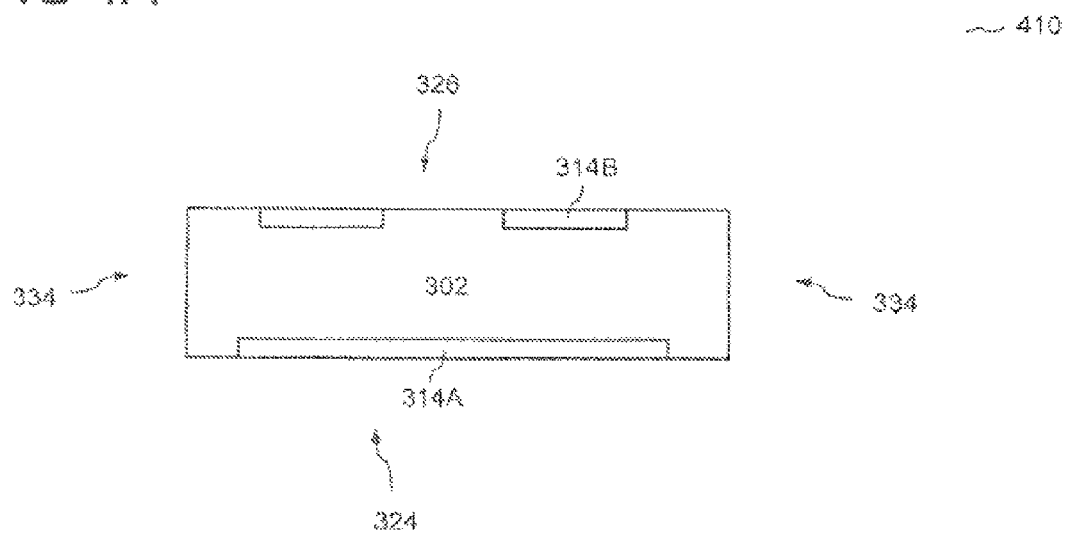

A cross-sectional view 410 of FIG. 4A shows the chip 302 according to an embodiment. The chip 302 may include a semiconductor device, e.g. a semiconductor die. The chip 302 may include a chip which may have already undergone front end processing, such a front end of line (FEOL) processes and back end of line (BEOL) processing to form one or more electrical devices in a semiconductor wafer. The chip 302 may include electrically active implant regions, e.g. source and/or drain regions and/or gate regions and/or gate oxide regions formed during FEOL processes, and electrical interconnects and/or metal layers and/or contact pads formed during BEOL processes.

The chip 302 may include one or more contact pads which may be electrically conductive. For example, the contact pads may include at least one of copper and aluminum. The first contact pad 314A may be formed over a bottom side 324 of the chip 302. The second contact pad 314B of the one or more contact pads may be formed over a top side 326 of the chip 302.

The chip 302 may include at least one of a power semiconductor chip, a semiconductor logic chip and a semiconductor memory chip. In some embodiments, the chip 302 may include a power semiconductor chip, which may include at least one of: a power transistor, a power MOS transistor, a power bipolar transistor, a power field effect transistor, a power insulated gate bipolar transistor, a thyristor, a MOS controlled thyristors, a silicon controlled rectifier, and a power schottky diode. As a power semiconductor chip, the chip 302 may be configured to support a vertical current flow through the chip 302 between a first contact pad 314A formed over the bottom side 324 and the second contact pad 314B formed over the top side 326. As a power chip, the chip 302 may be capable of carrying a voltage from about 50 V to about 5000 V, e.g. from about 100 V to about 3000 V, e.g. from about 500 V to about 1500 V. The chip 302 may have a thickness ranging from about 50 µm to about 600 µm, e.g. about 100 µm to about 300 µm, e.g. about 150 µm to about 250 µm.

Figure 4B:
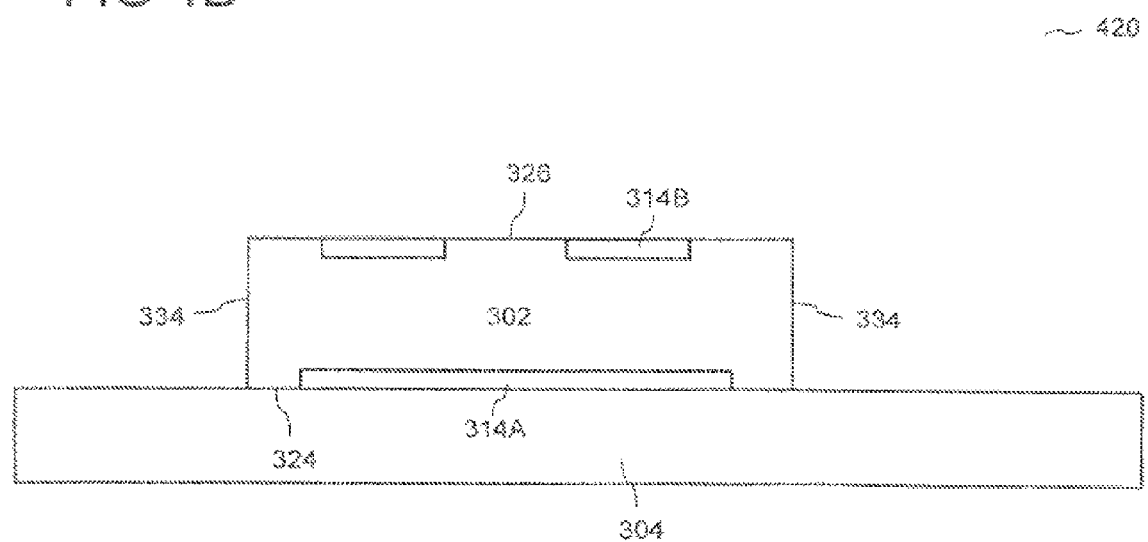

As shown in illustration 420 of FIG. 4B, the chip 302 may be disposed over the carrier 304. The carrier 304 may include an electrically conductive material. The carrier 304 may include a lead frame material, which may include at least one material from the following group of materials, the group of materials consisting of: copper, nickel, iron, copper alloy, nickel alloy, iron alloy, and the like.

The bottom side 324 of the chip 302 may be adhered to the carrier 304 and the first contact pad 314A may be electrically contacted to the carrier 304. The first contact pad 314A may also be referred to as a chip back side metallization. The first contact pad 314A may be electrically contacted to the carrier 304 via an electrically conductive adhesion material, e.g. at least one of a solder material, an electrically conductive paste or an electrically conductive glue.

Figure 4C:
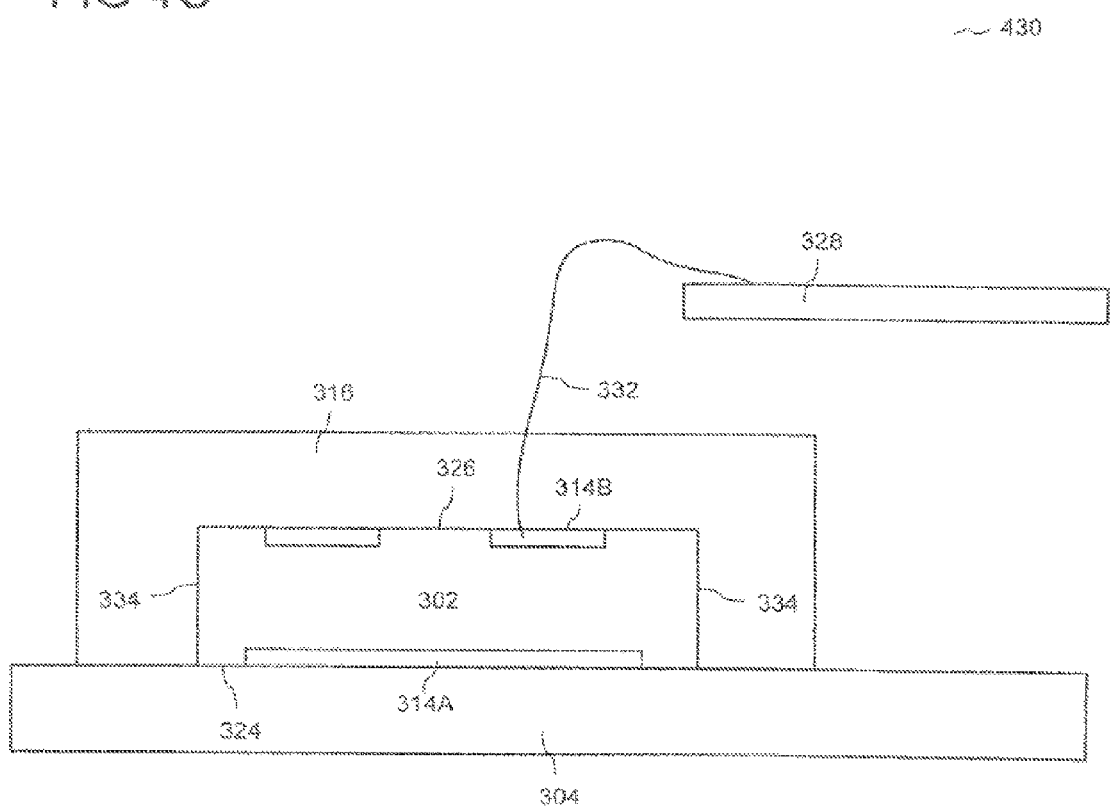

Subsequently, as shown in view 430 of FIG. 4C, the chip 302 may be at least partially surrounded with the first encapsulation material 316. The first encapsulation material 316 may be formed over or directly on the top side 326 of chip 302 and over or directly on one or more sidewalls 334 of the chip 302. In some other embodiments, the first encapsulation material 316 may cover the chip 302 at least partially on all sides of the chip 302.

The chip arrangement 322 may further include one or more electrically conductive leads 328. The one or more electrically conductive leads 328 may include a lead frame material, which may include at least one material from the following group of materials, the group of materials consisting of: copper, nickel, iron, copper alloy, nickel alloy, iron alloy. The Electrically conductive lead 328 may be referred to as a "leg" of a lead frame.

The electrically conductive lead 328 may be electrically connected to the second contact pad 314B via an electrical interconnect 332. The electrical interconnect 332 may include for example, a wire, such as a copper wire. The electrical interconnect 332 may be soldered to the electrically conductive lead 328 and the second contact pad 314B to form an electrically conductive connection between them. It may be understood that the chip arrangement 322 is not necessarily restricted to including only one electrically conductive lead even though only one electrically conductive lead 328 is shown here for simplicity. According to various embodiments, the chip arrangement 322 may include a plurality of electrically conductive leads, wherein each lead may be electrically connected to a separate contact pad of the chip 302.

Subsequently, as shown in view 440 of FIG. 4D, second encapsulation material 318 may be deposited and/or disposed. The second encapsulation material 318 may be formed over the first encapsulation material 316, such that the first encapsulation material 316 may be at least partially surrounded with the second encapsulation material 318. The second encapsulation material 318 may surround the first encapsulation material 316 which may be formed over the top side 326 of the chip 302 and over one or more sidewalls 334 of the chip 302. The second encapsulation material 318 may therefore also be formed over the top side 326 of the chip 302 and over one or more sidewalls 334 of the chip 302, wherein the first encapsulation material 316 may be arranged between the second encapsulation material 318 and the chip 302. The second encapsulation material 318 may also encapsulate the electrically conductive lead(s) 328, i.e. the leg(s) of a lead frame.

The first encapsulation material 316 and the second encapsulation material 318 may each include different electrically insulating materials.

In various embodiments, the first encapsulation material 316 may be formed having a thickness in the range from about 0.1 µm to about 0.3 µm, e.g. a thickness in the range from about 0.15 µm to about 0.25 µm, e.g. a thickness in the range from about 0.175 µm to about 0.225 µm, e.g. a thickness of about 0.2 µm. In various embodiments, the second encapsulation material 318 may be formed having a thickness in the range from about 1.0 mm to about 4.0 mm, e.g. a thickness in the range from about 1.5 mm to about 3.5 mm, e.g. a thickness in the range from about 2.0 mm to about 3.0 mm, e.g. a thickness of about 2.5 mm.

According to various embodiments, the first encapsulation material 316 may include at least one of a laminate and epoxy and the second encapsulation material 318 may include a thermoplast material. The chip 302 may first be embedded in at least one of a laminate and epoxy, and subsequently encapsulated with thermoplast. The thermoplast material may be deposited, e.g. by injection molding. The thermoplast material may include at least one of the following polymeric materials: polyethylene, polyvinyl chloride (PVC), polystyrene (PS), polyamide, and polypropylene (PP).

The chip arrangement 322 may include a power chip package with multi-encapsulation, which may make use of thermoplast molding, to lower manufacturing costs. Although thermoplast molding may typically suffer from a lack of long-term stability compared to thermoset materials, such as epoxy, chip 302 may be sufficiently protected because chip 302 may be embedded directly in epoxy or laminate. Furthermore, thermoplast as an outer mold formed over the inner mold first encapsulation material 316, may result in shorter cycle times, and better production efficiency. Special electrical and/or mechanical property requirements may no longer be placed on the second encapsulation material 318, as the first encapsulation material 316 is already present in the chip arrangement 322. According to various embodiments, the first encapsulation material 316 may include a laminate; and the second encapsulation material 318 may include an epoxy, e.g. an epoxy mold compound. According to various embodiments, the epoxy may offer better resistance against humidity than the laminate.

According to various embodiments, one of the first encapsulation material 316 and the second encapsulation material 318 may include a laminate; and the other of the first encapsulation material 316 and the second encapsulation material 318 may include a filled epoxy.

According to various embodiments, the filled epoxy may have greater electromagnetic shielding properties than the laminate. For example, in some embodiments, the filled epoxy may include filler particles, wherein the filler particles may include metal. In various embodiments, the metal may include one or more of the following metals or an alloy of a plurality of the following metals: Cu, Ni, Fe, Ag and/or Al. In various embodiments, the filler particles may have a diameter in the range from about 10 µm to about 100 µm.

According to various embodiments, the filled epoxy may have a higher thermal conductivity than the laminate. For example, in some embodiments, the filled epoxy may include filler particles, wherein filler particles may include at least one material from the following group of materials, the group of materials consisting of: boron nitride, aluminum nitride and metals. These filler particles may raise the thermal conductivity of the filled epoxy in comparison to the laminate. In various embodiments, the filler particles may have a diameter in the range from about 10 µm to about 100 µm.

According to various embodiments, the filled epoxy may have a higher mechanical hardness than the laminate. For example, in some embodiments, the filled epoxy may include filler particles, wherein filler particles may include at least one material from the following group of materials, the group of materials consisting of: silicon nitride and silicon oxide. In various embodiments, the filler particles may have a diameter in the range from about 10 µm to about 100 µm.

Figure 5A:
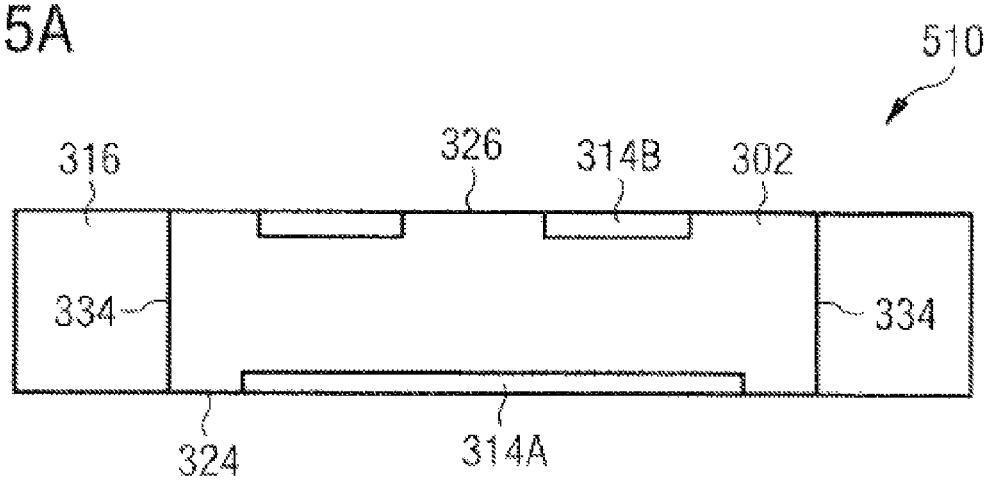
FIGS. 5A to 5C show illustrations of method for manufacturing a chip arrangement according to various embodiments.
Figure 5B:
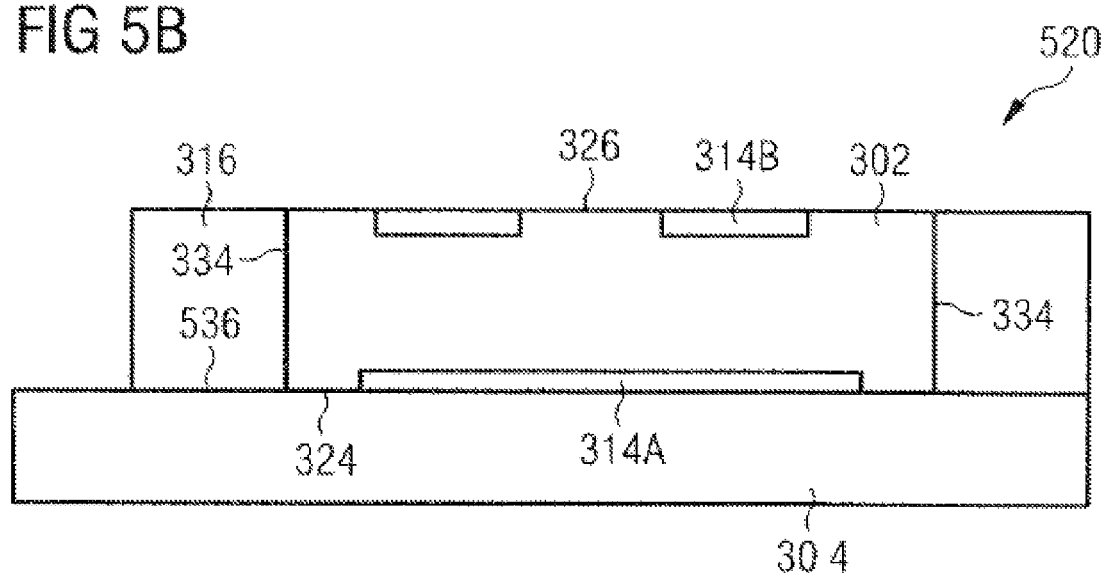
Figure 5C:
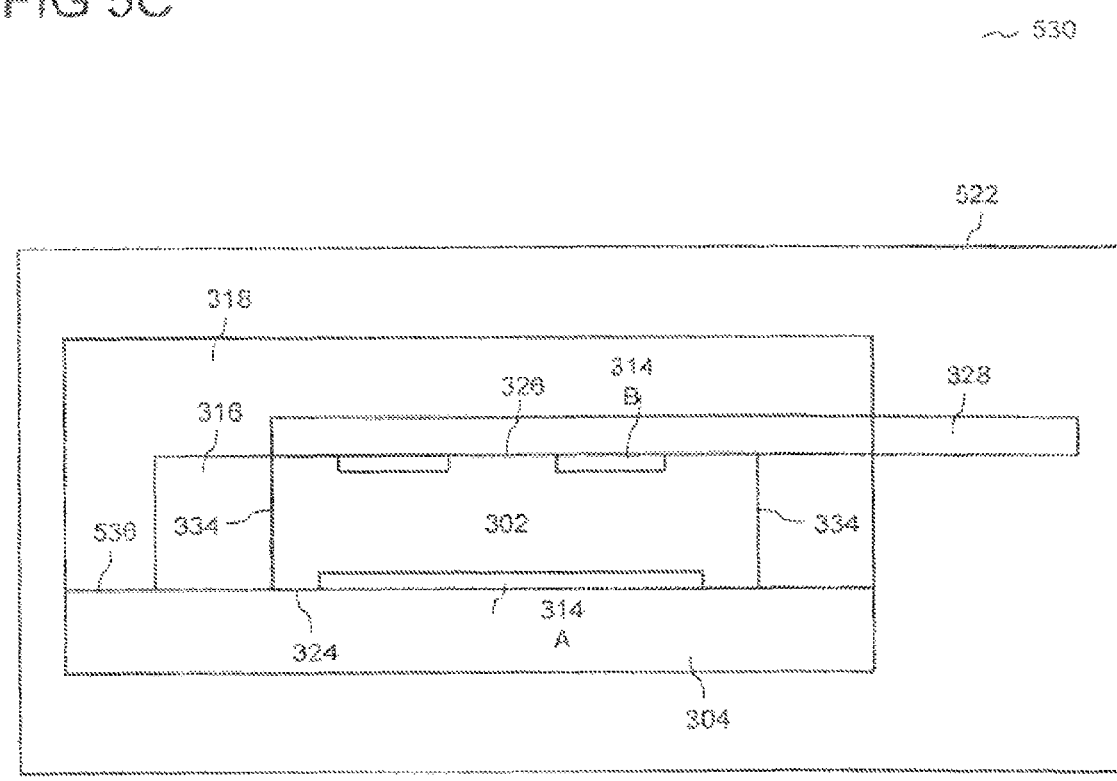

FIGS. 5A to 5C show illustrations of a method 500 for manufacturing a chip arrangement 522 according to various embodiments.

The method 500 may include one or more or all of the features of the method 400. However, in the method 500, the chip 302 may be at least partially surrounded with the first encapsulation material 316 before disposing the chip 302 over the carrier 304. For example, the first encapsulation material 316 may already encapsulate the chip 302 in an embedded chip package arrangement. This embedded chip package arrangement may include a flat package, such as a quad-flat-no-leads (QFN) package, e.g. an S308 or S208 chip package.

View 510 of FIG. 5A shows the chip 302 at least partially surrounded with the first encapsulation material 316. The first encapsulation material 316 may optionally be formed over the top side 326 of the chip 302 and over one or more sidewalls 334 of the chip. The first encapsulation material 316 may also optionally be formed over the bottom side 324 of the chip 302. However, the contact pads 314A, 314B may be exposed or free from the first encapsulation material 316.

As shown in view 520 of FIG. 5B, subsequently, the chip 302 may be disposed over the first carrier side 536, wherein the contact pad 314A of the chip 302 may be electrically contacted to the carrier 304.

As shown in view 530 of FIG. 5C, the electrically conductive lead 328 may be disposed over the first encapsulation material 316. The electrically conductive lead 328 may be disposed over the chip top side 326. The electrically conductive lead 328 may be electrically contacted to the contact pad 314B, for example by soldering.

Subsequently, the second encapsulation material 318 may be formed at least partially over at least one of the first encapsulation material 316 and the carrier 304. In some embodiments, the second encapsulation material 318 may be formed over the first encapsulation material 316 and the carrier 304. The second encapsulation material 318 may surround the first encapsulation material 316 formed over the top side 326 of the chip 302 and over one or more sidewalls 334 of the chip 302. The second encapsulation material 318 may be formed over the first carrier side 536. The second encapsulation material 318 may also surround at least part of the electrically conductive lead 328.

The first encapsulation material 316 and the second encapsulation material 318 may each include different electrically insulating materials.

According to various embodiments, the first encapsulation material 316 may include at least one of a laminate and epoxy. In other words, the chip 302 may be directly encapsulated with laminate or epoxy. For example, at least one of a laminate and epoxy may be formed directly on the chip 302, e.g. over the chip sidewalls and/or the chip top side 326 and/or the chip bottom side 324. The second encapsulation material 318 may include a thermoplast material.

According to various embodiments, the first encapsulation material 316 may include a laminate; and the second encapsulation material 318 may include an epoxy.

According to various embodiments, one of the first encapsulation material 316 and the second encapsulation material 318 may include a laminate; and the other of the first encapsulation material 316 and the second encapsulation material 318 may include a filled epoxy.

According to various embodiments, the filled epoxy may have greater electromagnetic shielding properties than the laminate. For example, in some embodiments, the filled epoxy may include filler particles, wherein the filler particles may include metal. In various embodiments, the metal may include one or more of the following metals or an alloy of a plurality of the following metals: Cu, Ni, Fe, Ag and/or Al. In various embodiments, the filler particles may have a diameter in the range from about 10 µm to about 100 µm.

According to various embodiments, the filled epoxy may have a higher thermal conductivity than the laminate. For example, in some embodiments, the filled epoxy may include filler particles, wherein filler particles may include at least one material from the following group of materials, the group of materials consisting of: boron nitride, aluminum nitride and metals. These filler particles may raise the thermal conductivity of the filled epoxy in comparison to the laminate. In various embodiments, the filler particles may have a diameter in the range from about 10 µm to about 100 µm.

According to various embodiments, the filled epoxy may have a higher mechanical hardness than the laminate. For example, in some embodiments, the filled epoxy may include filler particles, wherein filler particles may include at least one material from the following group of materials, the group of materials consisting of: silicon nitride and silicon oxide. In various embodiments, the filler particles may have a diameter in the range from about 10 µm to about 100 µm.

Figure 6:
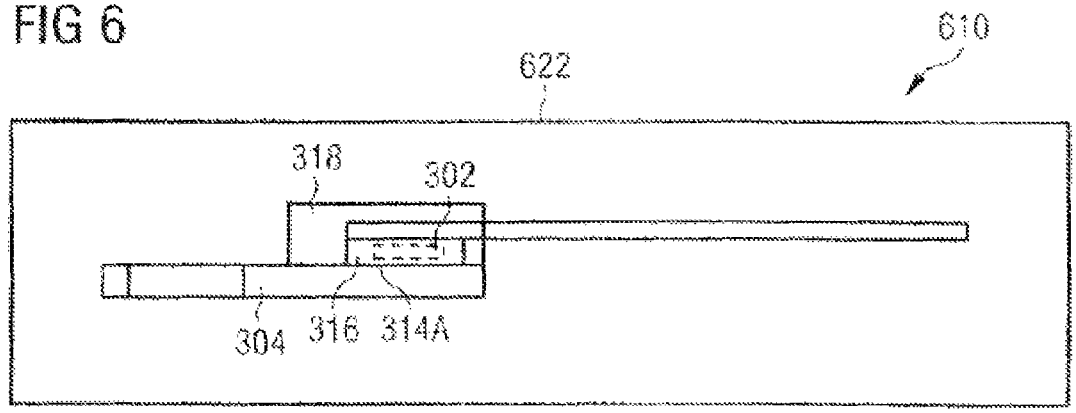
FIG. 6 shows a chip arrangement according to various embodiments.

FIG. 6 shows a side view 610 of a chip arrangement 622 according to various embodiments.

The chip arrangement 622 may include the carrier 304. The chip 302 may be at least partially surrounded by the first encapsulation material 316, wherein the contact pad 314A of the chip 302 may be disposed over and electrically contacted to the carrier 304. The second encapsulation material 318 may be formed at least partially over at least one of the first encapsulation material 316 and the carrier 304.

The chip arrangement 622 may be manufactured according processes described with respect to the method 500.

Figure 7:
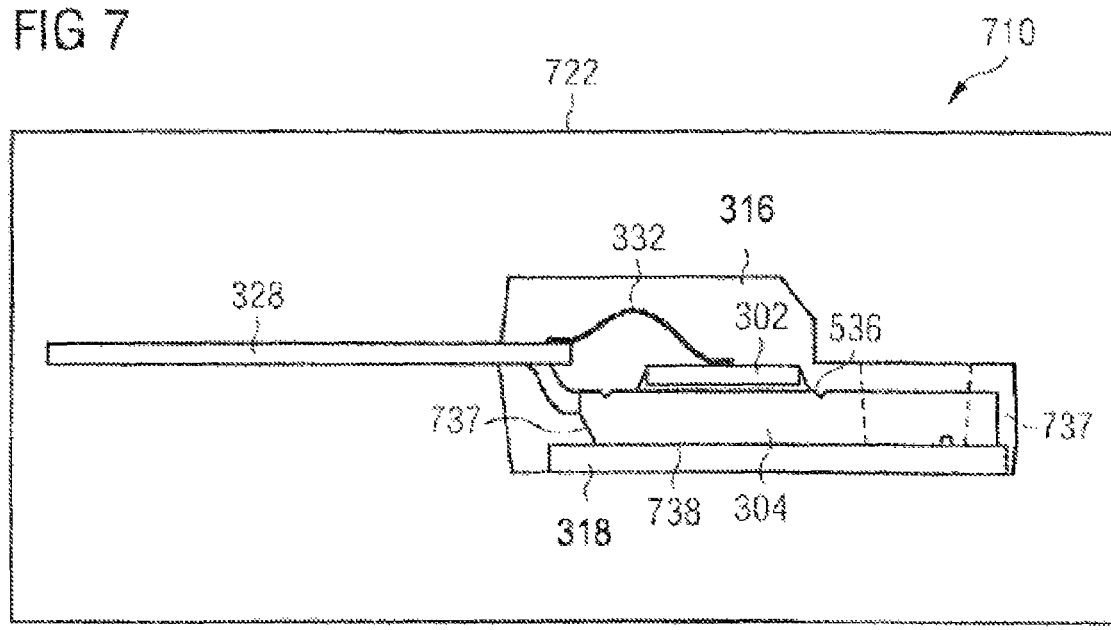
FIG. 7 shows a chip arrangement according to various embodiments.

FIG. 7 shows a cross-sectional view 710 of a chip arrangement 722 according to various embodiments.

The chip arrangement 722 may include a power chip package. The chip arrangement 722 may include the carrier 304. The chip 302 may be disposed over the carrier 304. The chip 302 may include one or more contact pads, wherein the first contact pad 314A of one or more contact pads may be electrically contacted to the carrier 304.

The electrically conductive lead 328 may be electrically connected to the second contact pad 314B, e.g. through soldering or through electrical wiring, such as via electrical interconnect 332.

The first encapsulation material 316 may be disposed over the chip 302. For example, the first encapsulation material 316 may at least partially surround the chip 302. The first encapsulation material 316 may be formed over the first carrier side 536.

In some embodiments, the first encapsulation material 316 may include an epoxy mold compound. In some embodiments, the first encapsulation material 316 may include a filled and/or highly filled epoxy, i.e. filled with filler particles. Such an epoxy may include an E-modulus of about 10 GpA to about 25 GpA. The first encapsulation material 316 may be molded over the first carrier side 536, e.g. similar to the transistor-outline TO 220 package molding. The first encapsulation material 316 may also be formed over the carrier side walls 737.

Using a mold tool, a mold cavity 744 may be formed in the first encapsulation material 316, wherein the mold cavity 744 may be formed over the second carrier side 738.

Whereas the second carrier side 738 may be substantially free from the first encapsulation material 316, the second encapsulation material 318 may be formed over the second carrier side 738, e.g. over the entire second carrier side 738 in a mold cavity 744. The second encapsulation material 318 may include a thermal interface material (TIM) which may be a thermal performance material. The thermal interface material may include at least one material from the following group of materials, the group consisting of: silicone oil, paste and/or grease. For example, the thermal interface material may include at least one of a Henkel or Shin Etsu isolation paste. The thermal interface material may have a clearly higher thermal conductivity than epoxy mold compound. The thermal interface material may have a thermal conductivity ranging from about 2 W/mk to about 5 W/mk, whereas the epoxy mold compound may have a thermal conductivity ranging of about 1 W/mk. Furthermore, the thermal interface material may have better gap filling properties, which may be able to seal and/or close any air gaps over the second carrier side 738 and a spacer 852. The thermal interface material may be compressible and soft. The thermal interface material may have an E-modulus of less than 1 GP. The thermal interface material may have a compressibility ranging from about 40% to about 60%. The thermal interface material may have a shore hardness ranging from about 50 A to about 100 A. The thermal interface material may be deposited by at least one of screen printing and/or compression molding.

FIGS. 8A to 8C show a method for manufacturing a chip arrangement 822 according to various embodiments.

As shown in cross-sectional view 810 of FIG. 8A, the chip arrangement 822 may be manufactured according to a method including one or more or all of the processes and/or features of the chip arrangement 722 already described with respect to the chip arrangement 722. However, instead of the second encapsulation material 318 being formed over the entire second carrier side 738, the chip arrangement 822, i.e. the component, may be provided with a spacer 852 formed over the second carrier side 738 which may provide and/or guarantee during the assembly a minimal isolations distance between the carrier 304 and an external cooling body. Typically, the distance may range from about 50 µm to about 250 µm. The spacer 852 may be formed, in some embodiments, through a modification of a bottom mold tool which results in the formation of cavity/cavities 844 over the second carrier side 738. The spacer 852 may be or may be formed by the first encapsulation material 316 being disposed over one or more portions of the second carrier side 738. The spacer 852 may have a thickness ranging from about 50 µm to about 250 µm, e.g. about 200 µm. As the first encapsulation material 316 may only be formed over some portions of the second carrier side 738, the first encapsulation material 316 may be understood to form at least one cavity 844 over the second carrier side 738, the cavity structure being defined by the first encapsulation material 316. The first encapsulation material 316 formed on the second carrier side 738 may form the sidewalls 742 of at least one cavity 844 on the second carrier side 738. In other words, the thickness of the first encapsulation material 316 formed on the second carrier side 738 may be equal to the depth of the mold cavity/cavities 844. This may range from about 50 µm to about 250 µm; e.g. about 100 µm to about 200 µm; e.g. about 200 µm. As shown in FIG. 8A, two cavities 844 may be formed on the second carrier side 738.

A through-hole 846 may be formed through the carrier 304 and the first encapsulation material 316 formed over the first carrier side 536 and the second carrier side 738. In other words, the through-hole 846 may be formed through the carrier 304 and the first encapsulation material 316 formed over the first carrier side 536 and the spacer 852.

As shown in cross-sectional view 820 of FIG. 8B, the second encapsulation material 318 may be formed in cavity/cavities 844 formed over the second carrier side 738. The second encapsulation material 318 may substantially fill and/or fully fill cavity/cavities 844 formed over the second carrier side 738. For example, the second encapsulation material 318 may have a thickness of about 300 µm; e.g. ranging from about 250 µm to about 350 µm. Therefore the minimum safety gap provided by the spacer 852 (the first encapsulation material 316) may be achieved while also providing excellent thermal properties with a soft and thermally conductive TIM material (the second encapsulation material 318).

The chip arrangements 722 and 822 may each include a transistor outline package, e.g. a TO package. The chip arrangements may employ the use of multiple encapsulants. In this way, the thermal properties in the critical areas of the chip package, e.g. directly under the chip 302, e.g. under the chip bottom side 324, and under the carrier 302, may be improved due to the presence of a high thermal performance material, e.g. a TIM material deposited directly onto the second carrier side 738.

As shown in FIG. 8C, a distance holder 848 may be formed or inserted within the through-hole 846 (not shown) of the chip arrangement 822, wherein the distance holder 848 may be surrounded by the first encapsulation material 316. For example, the distance holder 848 may be surrounded, e.g. wrapped or directly surrounded, by the first encapsulation material 316 over the first carrier side 536 (not shown) and by the spacer 852 over the second carrier side 738 (not shown). As the first encapsulation material 316 may be a harder material than the second encapsulation material 318, the distance holder 848 may be stably supported by the first encapsulation material 316 and the spacer 852. The distance holder 848 may be plugged and/or soldered and/or welded to an external cooling body 854 such as a heat sink, which may be arranged over the second carrier side 738. The distance holder 848 may itself be a cooling element capable of transferring heat away from the chip arrangement 822 to the external cooling body 854. The chip arrangement 822 may be part of an AC/DC and/or DC/DC transformer application circuit, wherein the chip arrangement 822 with multiple encapsulation may function as a standard through-hole package with improved thermal properties and mechanical stability.

FIG. 9 shows a method 900 for manufacturing a chip arrangement according to an embodiment. The method 900 may include:

at least partially surrounding a chip with a first encapsulation material (in 910);

disposing the chip over a first carrier side, wherein a contact pad of the chip is electrically contacted to the carrier (in 920); and forming a second encapsulation material at least partially over at least one of the first encapsulation material and the carrier (in 930).

Various embodiments provide a chip arrangement including: a carrier; a chip disposed over the carrier, the chip including one or more contact pads, wherein a first contact pad of the one or more contact pads is electrically contacted to the carrier; a first encapsulation material at least partially surrounding the chip; and a second encapsulation material at least partially surrounding the first encapsulation material.

According to an embodiment, the carrier includes an electrically conductive material.

According to an embodiment, the carrier includes a lead frame material, the lead frame material including at least one from the following group of materials, the group of materials consisting of: copper, nickel, iron, copper alloy, nickel alloy, iron alloy.

According to an embodiment, the chip includes at least one of a power semiconductor chip, a semiconductor logic chip and a semiconductor memory chip.

According to an embodiment, the chip includes a semiconductor device.

According to an embodiment, the first contact pad is formed over a bottom side of the chip; and wherein the bottom side of the chip is adhered to the carrier.

According to an embodiment, a second contact pad of the one or more contact pads is formed over a top side of the chip, wherein a bottom side of the chip is adhered to the carrier; and wherein the first encapsulation material is formed over a top side of the chip and over one or more sidewalls of the chip.

According to an embodiment, the first encapsulation material covers the chip at least partially on all sides of the chip.

According to an embodiment, the chip arrangement further includes an electrically conductive lead; wherein the electrically conductive lead is electrically connected to the second contact pad.

According to an embodiment, the electrically conductive lead is disposed over the first encapsulation material; and the second encapsulation material surrounds at least part of the electrically conductive lead.

According to an embodiment, the electrically conductive lead includes a lead frame material, the lead frame material including at least one material from the following group of materials, the group of materials consisting of: copper, nickel, iron, copper alloy, nickel alloy, iron alloy.

According to an embodiment, the second encapsulation material surrounds the first encapsulation material formed over the top side of the chip and over the one or more sidewalls of the chip.

According to an embodiment, the first encapsulation material and the second encapsulation material each include different electrically insulating materials.

According to an embodiment, the first encapsulation material includes at least one of a laminate and epoxy; and the second encapsulation material includes a thermoplast material.

According to an embodiment, the first encapsulation material includes a laminate; and the second encapsulation material includes an epoxy.

According to an embodiment, one of the first encapsulation material and second encapsulation material includes a laminate; and the other of the first encapsulation material and second encapsulation material includes a filled epoxy.

According to an embodiment, the filled epoxy includes filler particles, wherein the filler particles include metal.

According to an embodiment, the filled epoxy includes filler particles, wherein the filler particles include at least one material from the following group of materials, the group of materials consisting of: boron nitride, aluminum nitride and metals.

According to an embodiment, the filled epoxy includes filler particles, wherein the filler particles include at least one material from the following group of materials, the group of materials consisting of: silicon nitride and silicon oxide.

According to an embodiment, the filled epoxy has a higher thermal conductivity than the laminate.

According to an embodiment, the filled epoxy has a higher mechanical hardness than the laminate.

According to an embodiment, the filled epoxy has greater electromagnetic shielding properties than the laminate.

Various embodiments provide a chip arrangement including: a carrier; a chip at least partially surrounded by a first encapsulation material, wherein a contact pad of the chip is disposed over and electrically contacted to a carrier; and a second encapsulation material formed at least partially over at least one of the first encapsulation material and the carrier.

According to an embodiment, the second encapsulation material at least partially surrounds the first encapsulation material and the carrier.

According to an embodiment, one of the first encapsulation material and second encapsulation material includes a laminate; and the other of the first encapsulation material and second encapsulation material includes a filled epoxy.

According to an embodiment, the first encapsulation material includes at least one of a laminate and an epoxy; and the second encapsulation material includes a thermal interface material.

According to an embodiment, the thermal interface material includes at least one material from the following group of materials, the group consisting of: silicone oil, paste and grease.

According to an embodiment, the thermal interface material has a higher thermal conductivity than the laminate and the epoxy.

According to an embodiment, the first encapsulation material is formed over the first carrier side and the second carrier side; the first encapsulation material forms the sidewalls of at least one cavity on the second carrier side; and the second encapsulation material is formed in the cavity over the second carrier side.

According to an embodiment, the first encapsulation material is formed over the first carrier side and the second carrier side; and the chip arrangement further includes a through-hole formed through the carrier and the first encapsulation material formed over the first carrier side and the second carrier side; and a distance holder formed in the through-hole, wherein the distance holder is surrounded by the first encapsulation material.

Various embodiments provide a method for manufacturing a chip arrangement, the method including: disposing a chip over a carrier, the chip including one or more contact pads, wherein a first contact pad of the one or more contact pads is electrically contacted to the carrier; at least partially surrounding the chip with a first encapsulation material; and at least partially surrounding the first encapsulation material with a second encapsulation material.

According to an embodiment, the method includes at least partially surrounding the chip with the first encapsulation material before disposing the chip over the carrier.

According to an embodiment, the method further includes disposing an electrically conductive lead over the first encapsulation material, wherein the electrically conductive lead is electrically connected to a second contact pad of the one or more contact pads; and at least partially surrounding at least part of the electrically conductive lead with the second encapsulation material.

Various embodiments provide a method for manufacturing a chip arrangement, the method including: at least partially surrounding a chip with a first encapsulation material; disposing the chip over a first carrier side, wherein a contact pad of the chip is electrically contacted to the carrier; and forming a second encapsulation material at least partially over at least one of the first encapsulation material and the carrier.

According to an embodiment, the method includes forming the second encapsulation material over a second carrier side.

According to an embodiment, the first encapsulation material includes at least one of a laminate and an epoxy; and the second encapsulation material includes a thermal interface material.

According to an embodiment, the method further includes forming the first encapsulation material over a second carrier side, wherein the first encapsulation material forms the sidewalls of at least one cavity on the second carrier side; and forming the second encapsulation material in the cavity over the second carrier side.

According to an embodiment, the method further includes forming a through-hole through the carrier and the first encapsulation material formed over the first carrier side and the second carrier side; and inserting a distance holder in the through-hole, wherein the distance holder is surrounded by the first encapsulation material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip arrangement, the method comprising:
    disposing a chip over a carrier, the carrier comprising a first carrier side and a second carrier side, wherein the chip has a top side facing away from the first carrier side and a bottom side opposite the top side, wherein the top side comprises one or more contact pads and the bottom side comprises one or more contact pads;
    electrically connecting the bottom side of the chip to the first carrier side via the one or more contact pads of the bottom side;
    disposing a first encapsulation material over the first carrier side, wherein the first encapsulation material at least partially surrounds the chip, wherein the first encapsulation material comprises a thermoset material; and
    disposing a second encapsulation material over the second carrier side, wherein the second encapsulation material is in direct contact with the second carrier side, wherein the second encapsulation material comprises a thermal interface material.

2. The method of claim 1, wherein the second encapsulation material seals and/or closes any gaps over the second carrier side.

3. The method of claim 1, wherein the first encapsulation material and the second encapsulation material are disposed by different methods.

4. The method of claim 1, wherein the first encapsulation material is disposed by at least one of transfer molding, injection molding or compression molding.

5. The method of claim 1, wherein the second encapsulation material is disposed by at least one of transfer molding, injection molding, compression molding or screen-printing.

6. The method of claim 1, wherein the thermoset material comprises at least one of a laminate or an epoxy.

7. The method of claim 1, wherein the thermal interface material comprises at least one material selected from a group consisting of silicone oil, paste, and grease.

8. The method of claim 1, wherein the thermal interface material has a higher thermal conductivity than the thermoset material.

9. The method of claim 1, wherein the chip is a power chip.

10. A method for manufacturing a chip arrangement, the method comprising:
    disposing a chip over a carrier, the carrier comprising a first carrier side and a second carrier side, wherein the chip has a top side facing away from the first carrier side and a bottom side opposite the top side, wherein the top side comprises one or more contact pads and the bottom side comprises one or more contact pads;
    electrically connecting the bottom side of the chip to the first carrier side via the one or more contact pads of the chip bottom side;
    disposing a first encapsulation material over the first carrier side, wherein the first encapsulation material at least partially surrounds the chip; and
    disposing a second encapsulation material over the second carrier side, wherein the second encapsulation material is in direct contact with the second carrier side and the first encapsulation material.

11. The method of claim 10, wherein the first encapsulation material comprises a thermoset material and the second encapsulation material comprises a thermal interface material.

12. The method of claim 10, wherein the first encapsulation material and the second encapsulation material are disposed by different methods.

13. The method of claim 10, wherein the second encapsulation material seals and/or closes any gaps over the second carrier side.

14. The method of claim 10, wherein the first encapsulation material is disposed by at least one of transfer molding, injection molding, or compression molding.

15. The method of claim 10, wherein the second encapsulation material is disposed by at least one of transfer molding, injection molding, compression molding or screen-printing.

16. A method for manufacturing a chip arrangement, the method comprising:
    disposing a chip over a carrier, the carrier comprising a first carrier side and a second carrier side, wherein the chip has a top side facing away from the first carrier side and a bottom side opposite the top side, wherein the top side comprises one or more contact pads and the bottom side comprises one or more contact pads;
    electrically connecting the bottom side of the chip to the first carrier side via the one or more contact pads of the chip bottom side;

disposing a first encapsulation material over the first carrier side, wherein the first encapsulation material at least partially surrounds the chip;

disposing a second encapsulation material over the second carrier side, wherein the second encapsulation material is in direct contact with the second carrier side; and wherein one of the first encapsulation material or the second encapsulation material comprises a laminate or a sheet and the other of the first encapsulation material or the second encapsulation material comprises a mold compound or a filled epoxy.

17. The method of claim 16, wherein the second encapsulation material seals and/or closes any gaps over the second carrier side.

18. The method of claim 16, wherein the first encapsulation material and the second encapsulation material are disposed by different methods.

* * * * *